(12) United States Patent
Matsuki et al.

(10) Patent No.: US 6,784,123 B2
(45) Date of Patent: Aug. 31, 2004

(54) INSULATION FILM ON SEMICONDUCTOR SUBSTRATE AND METHOD FOR FORMING SAME

(75) Inventors: Nobuo Matsuki, Tama (JP); Yoshinori Morisada, Tama (JP); Yasuyoshi Hyodo, Tama (JP); Seijiro Umemoto, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 10/402,109

(22) Filed: Mar. 27, 2003

(65) Prior Publication Data

US 2003/0224622 A1 Dec. 4, 2003

Related U.S. Application Data

(63) Continuation-in-part of application No. 10/288,641, filed on Nov. 5, 2002, which is a continuation-in-part of application No. 09/827,616, filed on Apr. 6, 2001, now Pat. No. 6,514,880, which is a continuation-in-part of application No. 09/243,156, filed on Feb. 2, 1999, now abandoned, and a continuation-in-part of application No. 09/691,376, filed on Oct. 18, 2000, now Pat. No. 6,432,846, and a continuation-in-part of application No. 09/326,847, filed on Jun. 7, 1999, now Pat. No. 6,352,945, and a continuation-in-part of application No. 09/326,848, filed on Jun. 7, 1999, now Pat. No. 6,383,955

(60) Provisional application No. 60/442,731, filed on Jan. 24, 2003.

(30) Foreign Application Priority Data

Feb. 5, 1998 (JP) .............................. 10-37929

(51) Int. Cl.⁷ .............................................. H01L 21/31
(52) U.S. Cl. ...................................... 438/788; 438/789
(58) Field of Search ................................ 438/772, 780, 438/788, 789

(56) References Cited

U.S. PATENT DOCUMENTS

| | | | |
|---|---|---|---|
| 5,804,259 A | * | 9/1998 | Robles ...................... 438/780 |
| 6,107,184 A | * | 8/2000 | Mandal et al. .............. 438/780 |
| 6,352,945 B1 | | 3/2002 | Matsuki et al. |
| 6,383,955 B1 | | 5/2002 | Matsuki et al. |
| 6,410,463 B1 | | 6/2002 | Matsuki |
| 6,432,846 B1 | | 8/2002 | Matsuki |
| 6,436,822 B1 | | 8/2002 | Towle |
| 6,455,445 B2 | | 9/2002 | Matsuki |
| 6,458,720 B1 | * | 10/2002 | Aoi ........................... 438/789 |
| 6,514,880 B2 | | 2/2003 | Matsuki et al. |
| 6,518,169 B1 | * | 2/2003 | Jiwari et al. ................ 438/780 |
| 2003/0162408 A1 | | 8/2003 | Matsuki et al. |

FOREIGN PATENT DOCUMENTS

EP    1 225 194 A2    7/2002

OTHER PUBLICATIONS

U.S. patent application Ser. No. 10/317,239, Matsuki et al., filed Aug. 28, 2003.

* cited by examiner

*Primary Examiner*—Ernest Karlsen
*Assistant Examiner*—Lisa Kilday
(74) *Attorney, Agent, or Firm*—Knobbe Martens Olson & Bear, LLP

(57) ABSTRACT

An insulation film is formed on a semiconductor substrate by vaporizing a silicon-containing hydrocarbon compound to provide a source gas, introducing a reaction gas composed of the source gas and an additive gas such as an inert gas and oxidizing gas to a reaction space of a plasma CVD apparatus, and depositing a siloxan polymer film by plasma polymerization at a temperature of −50° C.–100° C. The residence time of the reaction gas in the reaction space is lengthened by reducing the total flow of the reaction gas in such a way as to form a siloxan polymer film with a low dielectric constant such as 2.5.

19 Claims, 2 Drawing Sheets

INSULATION FILM ON SEMICONDUCTOR SUBSTRATE AND METHOD FOR FORMING SAME

This is a continuation-in-part of U.S. patent application Ser. No. 10/288,641 filed Nov. 5, 2002, which is a continuation-in-part of U.S. patent application Ser. No. 09/827,616 filed Apr. 6, 2001 now U.S. Pat. No. 6,514,880, which is a continuation-in-part of (i) U.S. patent application Ser. No. 09/243,156 filed Feb. 2, 1999, now abandoned, which claims priority to Japanese patent application No. 37929/1998 filed Feb. 5, 1998, (ii) U.S. application Ser. No. 09/326,847 filed Jun. 7, 1999, now U.S. Pat. No. 6,352,945, (iii) U.S. patent application Ser. No. 09/326,848 filed Jun. 7, 1999, now U.S. Pat. No. 6,383,955, and (iv) U.S. patent application Ser. No. 09/691,376 filed Oct. 18, 2000, now U.S. Pat. No. 6,432,846, all of which are herein incorporated by reference in their entirety. This application also claims priority to U.S. provisional application No. 60/442,731 filed Jan. 24, 2003, the disclosure of which is herein incorporated by reference. This application claims priority to all of the foregoing under 35 U.S.C. § 119 and § 120.

BACKGROUND OF THE INVENTION

1. Field of the Invention

This invention relates generally to a semiconductor technique and more particularly to a silicone polymer insulation film on a semiconductor substrate and a method for forming the film by using a plasma CVD (chemical vapor deposition) apparatus.

2. Description of the Related Art

Because of the recent rise in requirements for the large-scale integration of semiconductor devices, a multi-layered wiring technique attracts a great deal of attention. In these multi-layered structures, however, capacitance among individual wires hinders high speed operations. In order to reduce the capacitance it is necessary to reduce dielectric constant of the insulation film. Thus, various materials having a relatively low dielectric constant have been developed for insulation films.

Conventional silicon oxide films $SiO_x$ are produced by a method in which oxygen $O_2$ or nitrogen oxide $N_2O$ is added as an oxidizing agent to a silicon source gas such as $SiH_4$ or $Si(OC_2H_5)_4$ and then processed by heat or plasma energy. Its dielectric constant is about 4.0.

Alternatively, a fluorinated amorphous carbon film has been produced from $C_xF_yH_z$ as a source gas by a plasma CVD method. Its dielectric constant ∈ is as low as 2.0–2.4.

Another method to reduce the dielectric constant of insulation film has been made by using the good stability of Si—O bond. A silicon-containing organic film is produced from a source gas under low pressure (1 Torr) by the plasma CVD method. The source gas is made from P-TMOS (phenyl trimethoxysilane, formula 1), which is a compound of benzene and silicon, vaporized by a babbling method. The dielectric constant ∈ of this film is as low as 3.1.

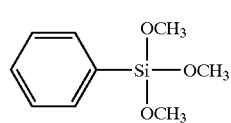

(1)

A further method uses a porous structure made in the film. An insulation film is produced from an inorganic SOG material by a spin-coat method. The dielectric constant ∈ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the dielectric constant of the film cannot be reduced to a desired degree.

In this regard, the babbling method means a method wherein vapor of a liquid material, which is obtained by having a carrier gas such as argon gas pass through the material, is introduced into a reaction chamber with the carrier gas. This method generally requires a large amount of a carrier gas in order to cause the source gas to flow. As a result, the source gas cannot stay in the reaction chamber for a sufficient length of time to cause polymerization in a vapor phase.

Further, the SOG insulation film of the spin-coat method has a problem in that the material cannot be applied onto the silicon substrate evenly and another problem in which a cure system after the coating process is costly.

It is, therefore, a principal object of this invention to provide a method for forming an improved insulation film.

It is another object of this invention to provide an insulation film that has a low dielectric constant and excellent film quality.

It is a still further object of this invention to provide a method for easily forming an insulation film that has a low dielectric constant without requiring an expensive device.

SUMMARY OF THE INVENTION

One aspect of this invention involves a method for forming an insulation film on a semiconductor substrate by using a plasma CVD apparatus including a reaction chamber, which method comprises a step of directly vaporizing a silicon-containing hydrocarbon compound expressed by the general formula $Si_\alpha O_\beta C_x H_y$ (α, β, x, and y are integers) and then introducing it to the reaction chamber of the plasma CVD apparatus, a step of introducing an additive gas as necessary into the reaction chamber and also a step of forming an insulation film on a semiconductor substrate by plasma polymerization reaction.

In particular, the present invention includes, but are not limited to, the following embodiments:

A method comprises the steps of: (a) vaporizing a silicon-containing hydrocarbon compound to provide a source gas; (b) introducing the source gas into a reaction space for plasma CVD processing wherein a semiconductor substrate is placed; (c) optionally introducing an additive gas selected from the group consisting of an inert gas, an oxidizing gas, and a plasma stabilizing gas, said source gas and said additive gas constituting a reaction gas; and (d) forming an insulation film on the semiconductor substrate by activating plasma polymerization reaction at a temperature of about −50° C. to about 100° C. in the reaction space, wherein the plasma polymerization reaction is activated while controlling the flow of the reaction gas to lengthen a residence time, Rt, of the reaction gas in the reaction space, wherein 100 msec≦Rt, $$Rt[s]=9.42\times10^7(Pr\cdot Ts/Ps\cdot Tr)r_w^2 d/F$$

wherein:
- Pr: reaction space pressure (Pa)
- Ps: standard atmospheric pressure (Pa)
- Tr: average temperature of the reaction (K)
- Ts: standard temperature (K)
- $r_w$: radius of the silicon substrate (m)
- d: space between the silicon substrate and the upper electrode (m)
- F: total flow volume of the reaction gas (sccm).

According to the present invention, a silicone polymer film having a micropore structure with a low dielectric constant can be produced. In an embodiment, the dielectric constant of the insulation film can be about 2.50 or lower. In the present invention, the reaction temperature is low, and the residence time is lengthened. Thus, the reaction on the surface of the substrate does not progress quickly, and polymers or oligomers formed in a gaseous phase in the reaction space can accumulate on the surface of the substrate without further reactions, so that the polymer or oligomer structures can remain when accumulating on the surface. As a result, polymers or oligomers (hereinafter simply "polymers") having structures close to ideal siloxan polymers can accumulate, thereby forming on the substrate a film having a low dielectric constant which is about 2.50 or lower.

In order to remove moisture and improve mechanical strength, the method may further comprise annealing the insulation film. In an embodiment, the annealing may be conducted approximately at 300° C.–450° C. by radiating the insulation film with UV light or electron beams or by using a heater under reduced pressure, thereby forming a film having excellent film quality.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
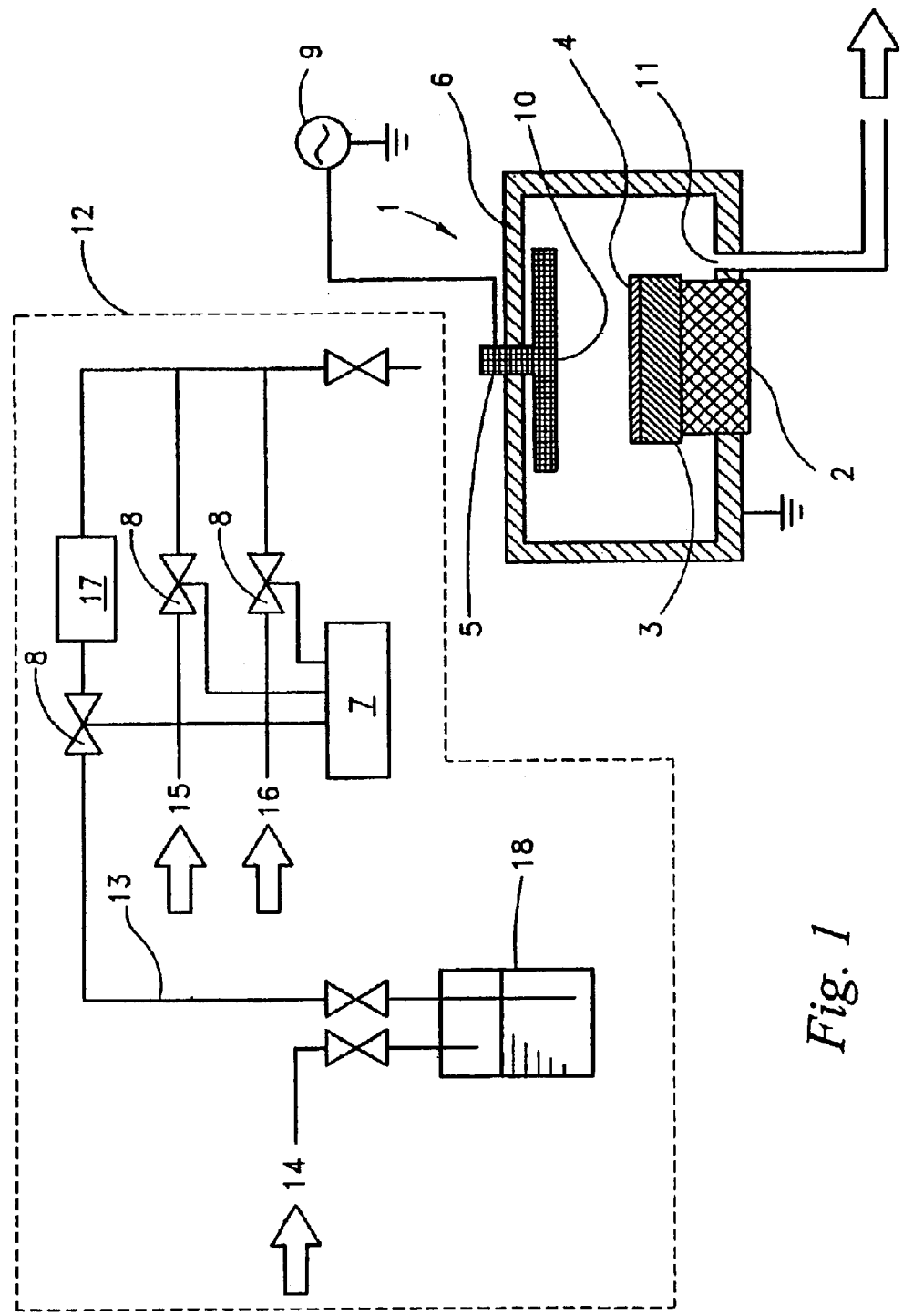
FIG. 1 is a schematic diagram illustrating a plasma CVD apparatus used for forming an insulation film of this invention.

In an embodiment of the present invention, a method comprising the steps of: (a) vaporizing a silicon-containing hydrocarbon compound to provide a source gas; (b) introducing the source gas into a reaction space for plasma CVD processing wherein a semiconductor substrate is placed; (c) optionally introducing an additive gas selected from the group consisting of a carrier gas, an oxidizing gas, and a plasma stabilizing gas, said source gas and said additive gas constituting a reaction gas; and (d) forming an insulation film on the semiconductor substrate by activating plasma polymerization reaction at a temperature of about −50° C. to about 100° C. in the reaction space, wherein the plasma polymerization reaction is activated while controlling the flow of the reaction gas to lengthen a residence time, Rt, of the reaction gas in the reaction space, wherein 100 msec≦Rt, $$Rt[s]=9.42\times10^7(Pr\cdot Ts/Ps\cdot Tr)r_w^2 d/F$$

wherein:
- Pr: reaction space pressure (Pa)
- Ps: standard atmospheric pressure (Pa)
- Tr: average temperature of the reaction (K)
- Ts: standard temperature (K)
- $r_w$: radius of the silicon substrate (m)
- d: space between the silicon substrate and the upper electrode (m)
- F: total flow volume of the reaction gas (sccm).

In the above, the reaction temperature includes −50° C., −40° C., −30° C., −20° C., −10° C., 0° C., 20° C., 40° C., 60° C., 80° C., and 100° C., and a range including any of the forgoing. Preferably, the temperature maybe about −10° C. to about 50° C.

The additive gas may be used for various purposes: A carrier gas may be used for carrying the source gas or controlling reaction of the source gas (due to its different excitation energy). In an embodiment, the inert gas is used and selected from the group consisting of Ar, Kr, Ne, $N_2$, and He. The carrier gas may be supplied at a flow rate of 0%–300% (including 50%, 100%, 150%, 200%, and 250%, and a range including any of the forgoing, preferably 200% or less) of that of the source gas.

An oxidizing gas may be used for oxidizing the source gas or supplying oxygen to the source gas. In an embodiment, the oxidizing gas may be selected from the group consisting of $O_2$, NO, $CO_2$, $O_3$, $H_2O$, and $N_2O$. The oxidizing gas may be supplied at a flow rate of 0%–300% (including 50%, 100%, 150%, 200%, and 250%, and a range including any of the forgoing, preferably 200% or less) of that of the source gas.

A plasma stabilizing gas may be used for stabilizing a plasma or facilitating polymerization or oligomerization of the source gas. In an embodiment, the plasma stabilizing gas may be selected from the group consisting of a $C_{1-4}$ alkanol such as ethylene glycol, 1,2-propanediol, and isopropyl alcohol; a $C_{2-4}$ ether such as diethyl ether; a $C_{4-12}$ aromatic hydrocarbons and $C_{4-12}$ alicyclic hydrocarbons including $C_{4-12}$ cycloalkanol such as 1,4-cyclohexane diol (b.p. 150° C./20 mm), 1,4-cyclohexane dimethanol (b.p. 283° C.), and 1,3-cyclopentane diol (80–85° C./0.1 Torr); $C_{4-12}$ alicyclic hydrocarbon unsaturated compounds such as 1,2,4-trivinylcyclohexane (b.p. 85–88° C./20 mm); and cyclic aldehyde $(CH_2O)_n$, $3\leq n\leq 6$. The plasma stabilizing gas may be supplied at a flow rate of 0%–1000% (including 50%, 100%, 200%, 300%, 400%, 500%, 600%, 700%, 800%, and 900%, and a range including any of the forgoing, preferably 500% or less) of that of the source gas.

Further, compounds having multiple reactive groups can also be used as a plasma stabilizing gas, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125–127° C.), and 1,4-cyclohexane dimethanol divinyl ether (b.p. 126° C./14 mm) $(H_2C=C(OH)-CH_2)_2-(CH_2)_6)$; and $C_{5-12}$ cycloalkanol vinyl compounds such as 1-vinylcyclohexanol (b.p. 74° C./19 mm).

The residence time, Rt, includes 100 msec, 150 msec, 200 msec, 250 msec, 300 msec, 350 msec, 400 msec, 450, msec, and 500 msec, and a range including any of the forgoing. Preferably, Rt is no less than 200 msec.

The RF power which is applied to the reaction space may have a high frequency (2 MHz or higher) and a power of 30W to 3000W (including 100W, 500W, 100W, and 200W, and a range including any of the forgoing). The high frequency RF power may be overlaid with low frequency RF power (less than 2 MHz such as 400 kHz) having an intensity of 0%–50% (including 5%, 10%, 20%, 30%, and 40%, and a range including any of the forgoing) of the high frequency RF power.

Annealing may be conducted under reduced pressure (e.g., in an evacuated chamber or in a vacuum) at a temperature of about 300° C. to about 450° C. to remove moisture from the insulation film and increase its mechanical strength. Any suitable thermal transferring means can be used, e.g., by radiating the insulation film with UV light, infrared light, electron beams, plasma (inert gas and/or reduction gas such as $H_2$ or $NH_3$), or by using a heater.

In an embodiment, the dielectric constant of the insulation film can be 2.50 or lower, including 2.40, 2.30, 2.20, 2.10, and 2.00, and a range including any of the forgoing.

In the present invention, as the source gas, those disclosed in United State patent application Ser. No. 10/317,239 filed Dec. 11, 2002 can be used, and the disclosure of the patent application is herein incorporated by reference in its entirety. Further, the silicon-containing hydrocarbon compound expressed as the general formula $Si_\alpha O_\beta C_x H_y$ ($\alpha$, $\beta$, x, and y are integers) includes, but not limited to, a compound having at least one Si—O bond, two or less $O-C_nH_{2n+1}$ bonds and at least two hydrocarbon radicals bonded with silicon (Si). More specifically, the silicon-containing hydrocarbon compound includes at least one species of the compound expressed by the chemical formula (2) as follows:

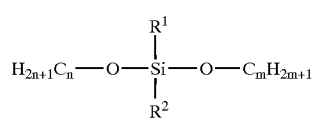

(2)

wherein R1 and R2 are one of $CH_3$, $C_2H_3$, $C_2H_5$, $C_3H_7$ and $C_6H_5$, and m and n are any integer.

Except for the species indicated above, the silicon-containing hydrocarbon compound can include at least one species of the compound expressed by the chemical formula (3) as follows:

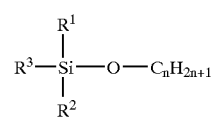

(3)

wherein R1, R2 and R3 are one of $CH_3$, $C_2H_3$, $C_2H_5$, $C_3H_7$ and $C_6H_5$, and n is any integer.

Except for those species indicated above, the silicon-containing hydrocarbon compound can include at least one species of the compound expressed by the chemical formula (4) as follows:

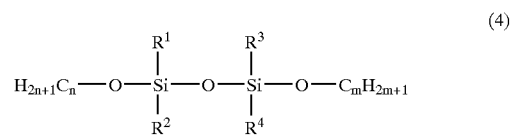

(4)

wherein R1, R2, R3 and R4 are one of $CH_3$, $C_2H_3$, $C_2H_5$, $C_3H_7$ and $C_6H_5$, and m and n are any integer.

Further, except for those species indicated above, the silicon-containing hydrocarbon compound can include at least one species of the compound expressed by the chemical formula (5) as follows:

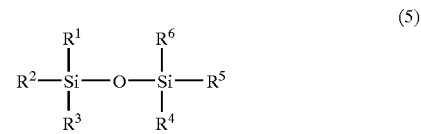

(5)

wherein R1, R2, R3, R4, R5 and R6 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Furthermore, except for those species indicated above, the silicon-containing hydrocarbon compound can include at least one species of the compound expressed by the chemical formula (6) as follows:

(6)

wherein R1, R2, R3 and R4 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Still further, the source gas can include at least one of said silicon-containing hydrocarbon compounds indicated above.

In accordance with another aspect of this invention, an insulation film is formed on a substrate and the film is polymerized with plasma energy in a plasma CVD apparatus by using a source gas including a silicon-containing hydrocarbon compound expressed by formula 2.

Additionally, the insulation film is formed on a substrate and the film is polymerized with plasma energy in a plasma CVD apparatus by using a source gas including a silicon-containing hydrocarbon compound expressed by formula 3.

Further, the insulation film is formed on a substrate and the film is polymerized with plasma energy in a plasma CVD apparatus by using a source gas including a silicon-containing hydrocarbon compound expressed by formula 4.

Furthermore, the insulation film is formed on a substrate and the film is polymerized with plasma energy in a plasma CVD apparatus by using a source gas including a silicon-containing hydrocarbon compound expressed by formula 5.

Still further, the insulation film is formed on a substrate and the film is polymerized with plasma energy in a plasma CVD apparatus by using a source gas including a silicon-containing hydrocarbon compound expressed by formula 6.

In accordance with a further aspect of this invention, a material for forming an insulation film is supplied in a vapor phase in the vicinity of a substrate and is treated in a plasma CVD apparatus to form the insulation film on the substrate by chemical reaction, and the material is further expressed by formula 2.

Additionally, a material for forming an insulation film is supplied in a vapor phase in the vicinity of a substrate and is treated in a plasma CVD apparatus to form the insulation film on the substrate by chemical reaction, and the material is further expressed by formula 3.

Further, a material for forming an insulation film is supplied in a vapor phase in the vicinity of a substrate and is treated in a plasma CVD apparatus to form the insulation film on the substrate by chemical reaction, and the material is further expressed by formula 4.

Furthermore, a material for forming an insulation film is supplied in a vapor phase with either nitrogen oxide ($N_2O$) or oxygen ($O_2$) as an oxidizing agent in the vicinity of a substrate and is treated in a plasma CVD apparatus to form said insulation film on said substrate by chemical reaction, and this material can be the compound expressed by formula 5.

Still further, a material for forming an insulation film is supplied in a vapor phase with either nitrogen oxide ($N_2O$) or oxygen ($O_2$) as the oxidizing agent in the vicinity of a substrate and is treated in a plasma CVD apparatus to form said insulation film on said substrate by chemical reaction, and this material further can be the compound expressed by formula 6.

The residence time (Rt: defined above) of the reaction gas is determined based on the capacity of the reaction chamber for reaction, the pressure adapted for reaction, and the total flow of the reaction gas. The reaction pressure is normally in the range of 1–10 Torr, preferably 3–7 Torr, so as to maintain stable plasma. This reaction pressure is relatively high in order to lengthen the residence time of the reaction gas. The total flow of the reaction gas is important to reducing the dielectric constant of a resulting film. It is not necessary to control the ratio of the source gas to the additive gas. In general, the longer the residence time, the lower the dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas is expected to be included in the reaction gas. That is approximately $1.6 \times 10^2$ sccm per the surface area of the substrate ($m^2$). The total flow can be defined by residence time (Rt). When Rt is defined described below, a preferred range of Rt is 100 msec$\leq$Rt, more preferably 200 msec$\leq$Rt$\leq$5 sec. In a conventional plasma TEOS, Rt is generally in the range of 10–30 msec.

In the above, the average temperature of the reaction (Tr) is the average temperature of the reaction gas at the substrate, which can be determined by measuring the temperature of the susceptor. The reaction gas comprises a source gas (i.e., material gas or precursor gas) and an additive gas (e.g., a carrier gas, an oxidizing gas, a plasma stabilizing gas, etc.). If no additive gas is used, the source gas itself corresponds to the reaction gas.

In the above, the residence time means the average period of time in which gas molecules stay in the reaction chamber. The residence time (Rt) can be calculated at Rt=$\alpha$V/S, wherein V is the capacity of the chamber (cc), S is the volume of the reaction gas (cc/s), and $\alpha$ is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, $\alpha$ can be estimated as 1/2. In the above formula, $\alpha$ is 1/2.

In this method, the source gas is, in short, a silicon-containing hydrocarbon compound including at least one Si—O bond, at most two O—$C_nH_{2n+1}$ bonds and at least two hydrocarbon radicals bonded to the silicon (Si). Also, this source gas is vaporized by a direct vaporization method. The method results in an insulation film having a low dielectric constant, high thermal stability and high humidity-resistance.

More specifically, the source gas vaporized by the direct vaporization method can stay in the plasma for a sufficient length of time. As a result, a linear polymer can be formed so that a linear polymer having the basic structure (formula 7), wherein the "n" is 2 or a greater value, forms in a vapor phase. The polymer is then deposited on the semiconductor substrate and forms an insulation film having a micropore porous structure.

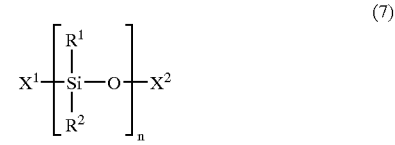

(7)

wherein X1 and X2 are $O_nC_mH_p$ wherein n is 0 or 1, m and p are integers including zero.

The insulation film of this invention has a relatively high stability because its fundamental structure has the Si—O bond having high bonding energy therebetween. Also, its dielectric constant is low because it has a micropore porous structure. Further, the fundamental structure (—SiO—)$_n$ has, on both sides, dangling bonds ending with a hydrocarbon radical possessing hydrophobicity, and this property renders the humidity-resistance. Furthermore, the bond of a hydrocarbon radical and silicon is generally stable. For instance, both the bond with a methyl radical, i.e., Si—$CH_3$, and bond with benzene, i.e., Si—$C_6H_5$, have a dissociation temperature of 500° C. or higher. Since above semiconductor production requires thermal stability to temperatures above 450° C., that property of the film is advantageous for production of semiconductors.

Further aspects, features and advantages of this invention will become apparent from the detailed description of the preferred examples which follows.

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a source gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus of this invention comprises a step of directly vaporizing silicon-containing hydrocarbon compounds expressed by the general formula $Si_\alpha O_\beta C_x H_y$ ($\alpha$, $\beta$, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma polymerization reaction wherein mixed gases, made from the silicon-containing hydrocarbon compound as a source gas and the additive gas, are used as a reaction gas. It is a remarkable feature that the reduction of the additive gas flow also renders a substantial reduction of the total flow of the reaction gas. This feature will be described in more detail later.

In this regard, the silicon-containing hydrocarbon compound expressed as the general formula $Si_\alpha O_\beta C_x H_y$ ($\alpha$, $\beta$, x, and y are integers) is preferably a compound having at least one Si—O bond, two or less O—$C_n H_{2n+1}$ bonds and at least two hydrocarbon radicals bonded with silicon (Si). More specifically, it is a compound indicated by A) chemical formula:

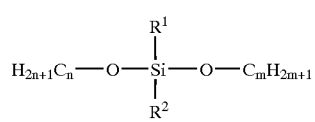

(2)

wherein R1 and R2 are one of $CH_3$, $C_2H_3$, $C_2H_5$, $C_3H_7$ and $C_6H_5$, and m and n are any integers; a compound indicated by B) chemical formula:

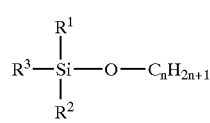

(3)

wherein R1, R2 and R3 are one of $CH_3$, $C_2H_3$, $C_2H_5$, $C_3H_7$ and $C_6H_5$, and n is any integer; a compound indicated by C) chemical formula:

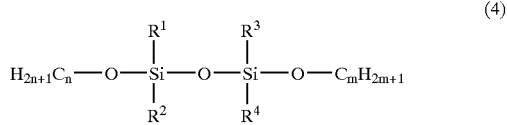

(4)

wherein R1, $R_2$, R3 and R4 are one of $CH_3$, $C_2H_3$, $C_2H_5$, $C_3H_7$ and $C_6H_5$, and m and n are any integer; a compound indicated by D) chemical formula:

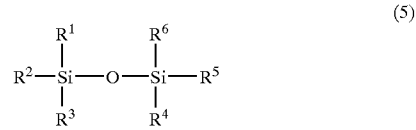

(5)

wherein R1, R2, R3, R4, R5 and R6 are one of $CH_3$, $C_2H_3$, $C_2H_5$, $C_3H_7$ and $C_6H_5$, and a mixture of the compound with nitrogen oxide ($N_2O$) or oxygen ($O_2$) as an oxidizing agent; or a compound indicated by E) chemical formula:

(6)

wherein R1, R2, R3 and R4 are one of $CH_3$, $C_2H_3$, $C_2H_5$, $C_3H_7$ and $C_6H_5$, and a mixture of the compound with nitrogen oxide ($N_2O$) or oxygen ($O_2$) as an oxidizing agent.

Further, it should be noted that the silicon-containing hydrocarbon compound can be any combinations of these compounds and mixtures.

The additive gases used in this embodiment, more specifically, are argon gas and helium gas. Argon is principally used for stabilizing plasma, while helium is used for improving uniformity of the plasma and also uniformity of thickness of the insulation filming.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the source gas. This differs greatly with a babbling method. Accordingly, a large amount of argon gas or helium gas is no longer necessary and this reduces the total gas flow of the reaction gas and then lengthens the time in which the source gas stays in the plasma. As a result, sufficient polymerizing reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the source gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF power, which preferably has a frequency of 13.4 MHz overlaid with low frequency RF power having a frequency of 430 kHz, and the space serves as a plasma field. The susceptor 3 continuously heats the semiconductor substrate 4 with the heater 2 and maintains the substrate 4 at a predetermined temperature that is desirably 350–450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the source gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the dielectric constant or other characteristics of a film formed on the substrate (e.g., in Example 5 described later, the ratio was 3:2).

The remaining oxygen, which is derived from the source gas and is not incorporated into the film, is dissociated from the material compound and floats in plasma. The ratio of Si:O in the source gas varies depending upon the compound. For example, in formulae 2–6 above, the ratio of O:Si is 2:1, 1:1, 3:2, 1:2, and 0:1, respectively. If the source gas having a high ratio of O:Si (e.g., 3/2 or higher) is used, the quantity of oxygen floating in plasma increases. When the quantity of oxygen increases, the organic groups, which are directly bound to Si and necessary to form a film, are oxidized, and as a result, deterioration of the film is likely to occur. In the above, by adding a reducing agent such as $H_2$ and $CH_4$ to the reaction chamber, the oxygen partial pressure in plasma is reduced, thereby preventing the above oxidization of the organic groups. In contrast, when the O:Si ratio is low (e.g., 3/2 or lower), it is necessary to supply oxygen for forming a film by adding an oxidizing agent such as $N_2O$ and $O_2$. The appropriate amount of a reducing agent or an oxidizing agent can be evaluated in advance based on preliminary experiment in which the composition of a formed film is analyzed by FT-IR or XRS, and its dielectric constant is also analyzed. Accordingly, by selecting the appropriate type of additive gas such as He, Ar, a reducing agent, and an oxidizing agent, and by controlling the quantity of each gas to be added, a film having the desired quality can be produced.

In the above, the silicon-containing hydrocarbon compound to produce a source gas for silicone polymer has preferably two alkoxy groups or less or having no alkoxy group. The use of a source gas having three or more alkoxy groups interferes with formation of linear silicone polymer, resulting in relatively high dielectric constant of a film. In the above, one molecule of the compound preferably contains one, two, or three Si atoms, although the number of Si atoms is not limited (the more the Si atoms, the vaporization becomes more difficult, and the cost of synthesis of the compound becomes higher). The alkoxy group may normally contain 1–3 carbon atoms, preferably one or two carbon atoms. Hydrocarbons bound to Si have normally 1–12 carbon atoms, preferably 1–6 carbon atoms. A preferable silicon-containing hydrocarbon compound has formula:

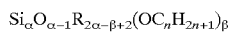

$$Si_\alpha O_{\alpha-1} R_{2\alpha-\beta+2}(OC_n H_{2n+1})_\beta$$

wherein α is an integer of 1–3, β is 0, 1, or 2, n is an integer of 1–3, and R is $C_{1-6}$ hydrocarbon attached to Si. The use of an oxidizing agent or a reducing agent is determined depending on the target dielectric constant (3.30 or less, preferably 3.10 or less, more preferably 2.80 or less) of a silicone polymer film and other characteristics such as stability of dielectric constant and thermal stability. The O:Si ratio in the source gas is also considered to select an oxidizing agent or a reducing agent, as described above. Preferably, if the ratio is lower than 3:2, an oxidizing agent is used, whereas if the ratio is higher than 3:2, a reducing agent is used. Further, an inert gas such as Ar and He is for controlling plasma reaction, but is not indispensable to form a silicone polymer film. The flow of source gas and the flow of additive gas can also vary depending on the plasma CVD apparatus. The appropriate flow can be determined by correlating the dielectric constant of the silicone polymer film with the residence time of the reaction gas (composed of the source gas and the additive gas). The longer the residence time, the lower the dielectric constant becomes. A reduction rate of dielectric constant per lengthened residence time is changeable, and after a certain residence time, the reduction rate of dielectric constant significantly increases, i.e., the dielectric constant sharply drops after a certain residence time of the reaction gas. After this dielectric constant dropping range, the reduction of dielectric constant slows down. This is very interesting. In the present invention, by lengthening residence time until reaching the dielectric constant dropping range based on a predetermined correlation between the dielectric constant of the film and the residence time of the reaction gas, it is possible to reduce the dielectric constant of the silicone polymer film significantly.

EXAMPLES

Experiments were conducted as described below, using DM-DMOS (dimethyl dimethoxysilane). The conditions and the results are indicated in the table below (see the residence time equation for explanation of the symbols). In these experiments, an ordinary plasma CVD device (EAGLE-10™, ASM Japan K.K.) was used as an experimental device wherein:

$r_w$ (radius of the silicon substrate): 0.1 m d (space between the silicon substrate and the upper electrode): 0.024 m Ps (standard atmospheric pressure): $1.01 \times 10^5$ Pa Ts (standard temperature): 273 K The dielectric constant was measured after heating the film at 420° C. in a vacuum to remove excess moisture. The reaction temperature was (Tr) was the temperature of the susceptor, which is substantially equal to the temperature on the substrate which corresponds to the reaction temperature.

Table 1 lists comparative examples and present invention's examples.

TABLE 1

|  | Com. Ex. 1 | Com. Ex. 2 | Com. Ex. 3 | Com. Ex. 4 | Ex. 1 |
| --- | --- | --- | --- | --- | --- |
| DMDMOS (sccm) | 140 | 200 | 200 | 200 | 100 |
| IPA (sccm) | — | — | — | 200 | 200 |
| He (sccm) | 30 | 1500 | 1500 | 100 | 100 |
| O2 (sccm) | 70 | 500 | 100 | 50 | 50 |
| Pr (Pa)/(Torr) | 650/4.9 | 534/4.0 | 534/4.0 | 700/5.3 | 700/5.3 |
| RF (W) | 1500 | 1000 | 1000 | 900 | 900 |
| F (sccm) | 240 | 2200 | 1800 | 550 | 450 |
| Tr (° C.)/(K) | 400/673 | 0/273 | 0/273 | 400/673 | 0/273 |
| Rt (ms) | 277 | 61 | 75 | 130 | 392 |
| k | 2.45 | 3.10 | 3.30 | 2.65 | 2.25 |

IPA: isopropyl alcohol; k: dielectric constant

As shown in the table, in Comparative Examples 1 and 2, although the reaction temperature was low, the residence time was short (the flow rate was high), resulting in relatively high dielectric constants. In contrast, in Example 1, because the reaction temperature was low and the residence time was long, the dielectric constant of the film was significantly low (2.25). In Comparative Example 1, even if the residence time was long, because the reaction temperature was high, the resulting film did not have as low a dielectric constant as the film of Example 1.

Figure 2:
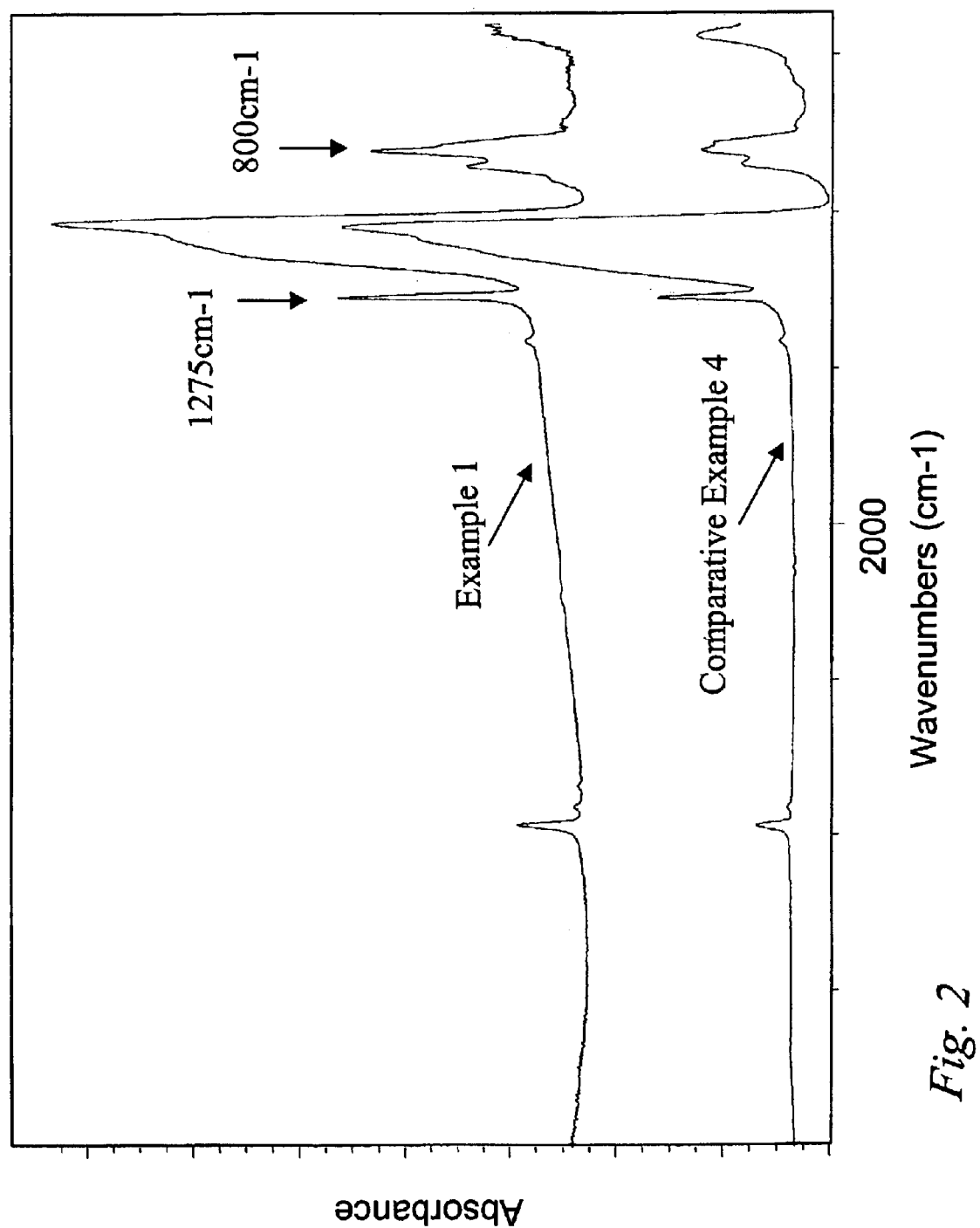
FIG. 2 is FT-IR profiles (infrared absorption spectra) showing the structures of formed films obtained in an example of the present invention and an comparative example.

FIG. 2 is FT-IR profiles (infrared absorption spectra) showing structures of the films of Comparative Example 4 and Example 1, respectively. The absorption peak at 1275 cm$^{-1}$ represents Si—CH$_3$ bonds, and the absorption peak at 800 cm$^{-1}$ represents Si(CH$_3$)$_2$ bonds. In Example 1, the absorption peaks are significantly greater than those in Comparative Example 4, indicating that the film of Example 1 possess structures of (—Si(CH$_3$)$_2$—O—)$_n$ which are close to ideal siloxan polymers.

Although this invention has been described in terms of certain examples, other examples apparent to those of ordinary skill in the art are within the scope of this invention. Accordingly, the scope of the invention is intended to be defined only by the claims that follow. The present invention includes various embodiments and are not limited to the above examples. The present invention particularly includes, but are not limited to, the following embodiments, and any combination of the forgoing embodiments and the following embodiments can readily be accomplished:

In the present invention, the reaction space should not be limited to a physically defined single section, but should include any suitable space for plasma reaction. That is, as one of ordinary skill in the art readily understands, the space is a functionally defined reaction space. The space may be comprised of a physically defined single section such as the interior of a reactor, or physically defined multiple sections communicated with each other for plasma reaction, such as the interior of a remote plasma chamber and the interior of a reactor. Further, the space includes the interior of piping connecting multiple sections through which a reaction gas passes. The interior of the reactor includes only the space used for plasma reaction. Thus, if only a part of the reactor interior is used for plasma reaction where the reactor is composed of multiple sections, only the part used for plasma reaction constitutes a reaction space. Further, the plasma reaction includes a preliminary reaction for plasma polymerization.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an insulation film on a semiconductor substrate by plasma reaction, comprising the steps of:
   vaporizing a silicon-containing hydrocarbon compound to provide a source gas;
   introducing the source gas into a reaction space for plasma CVD processing wherein a semiconductor substrate is placed;
   optionally introducing an additive gas selected from the group consisting of a carrier gas, an oxidizing gas, and a plasma stabilizing gas, said source gas and said additive gas constituting a reaction gas; and
   forming an insulation film on the semiconductor substrate by activating plasma polymerization reaction at a temperature of about −50° C. to about 100° C. in the reaction space, wherein the plasma polymerization reaction is activated while controlling the flow of the reaction gas to lengthen a residence time, Rt, of the reaction gas in the reaction space, wherein 100 msec≦Rt, $$Rt[s] = 9.42 \times 10^7 (Pr \cdot Ts/Ps \cdot Tr) r_w^2 d/F$$

wherein:
   Pr: reaction space pressure (Pa)
   Ps: standard atmospheric pressure (Pa)
   Tr: average temperature of the reaction (K)
   Ts: standard temperature (K)
   $r_w$: radius of the silicon substrate (m)
   d: space between the silicon substrate and the upper electrode (m)
   F: total flow volume of the reaction gas (sccm).

2. The method according to claim 1, wherein the reaction temperature is about −10° C. to about 50° C.

3. The method according to claim 1, wherein the carrier gas is introduced into the reaction space, said carrier gas being an inert gas selected from the group consisting of Ar, Ne, and He.

4. The method according to claim 1, wherein the oxidizing gas is introduced into the reaction space, said oxidizing gas being selected from the group consisting of $O_2$, NO, $CO_2$, and $N_2O$.

5. The method according to claim 1, wherein the plasma stabilizing gas is introduced into the reaction space, said plasma stabilized gas having formula CxHyOz, wherein x, y, and z are integers, which is at least one selected from the group consisting of a $C_{1-4}$ alkanol, a $C_{2-4}$ ether, a $C_{4-12}$ aromatic hydrocarbons, $C_{4-12}$ alicyclic hydrocarbons, and cyclic aldehyde $(CH_2O)_n$, $3 \leq n \leq 6$.

6. The method according to claim 1, wherein the residence time, Rt, is about 200 msec or longer.

7. The method according to claim 1, further comprising annealing the insulation film.

8. The method according to claim 1, wherein the annealing is conducted at a temperature of about 300° C. to about 450° C. by radiating under reduced pressure the insulation film with UV light, infrared light, electron beams, or plasma using inert gas and/or reduction gas of $H_2$ or <$NH_3$.

9. The method according to claim 1, wherein the flow of the reaction gas is controlled to render the dielectric constant of the insulation film as low as 2.50 or lower.

10. The method according to claim 1, wherein said silicon-containing hydrocarbon has the formula $Si_\alpha O_{\alpha-1} R_{2\alpha-\beta+2}(OC_nH_{2n+1})_\beta$ wherein $\alpha$ is an integer of 1–3, $\beta$ is an integer of 0–2, n is an integer of 1–3, and R is $C_{1-6}$ hydrocarbon attached to Si, thereby forming, as the insulation film, a siloxan polymer film having —$SiR_2O$— repeating structural units.

11. The method according to claim 10, wherein the silicon-containing hydrocarbon compound has two alkoxy groups ($\beta=2$).

12. The method according to claim 10, wherein the alkoxy present in the silicon-containing hydrocarbon has 1 to 3 carbon atoms.

13. The method according to claim 10, wherein the hydrocarbon present in the silicon-containing hydrocarbon compound has 1 to 6 carbon atoms (n=1–6).

14. The method according to claim 10, wherein the silicon-containing hydrocarbon compound has 1 to 3 silicon atoms.

15. The method according to claim 10, wherein the silicon-containing hydrocarbon compound has 1 to 2 silicon atoms ($\alpha=1$ or 2).

16. A method for forming an insulation film on a semiconductor substrate by plasma reaction, comprising the steps of:
vaporizing a silicon-containing hydrocarbon compound to provide a source gas;
introducing the source gas into a reaction space for plasma CVD processing wherein a semiconductor substrate is placed;
introducing an additive gas selected from the group consisting of a carrier gas, an oxidizing gas, and a plasma stabilizing gas, said source gas and said additive gas constituting a reaction gas;
forming an insulation film on the semiconductor substrate by activating plasma polymerization reaction at a temperature of about −50° C. to about 100° C. in the reaction space, wherein the plasma polymerization reaction is activated while controlling the flow of the reaction gas to lengthen a residence time, Rt, of the reaction gas in the reaction space, wherein 100 msec $\leq$ Rt $$Rt[s] = 9.42 \times 10^7 (Pr \cdot Ts/Ps \cdot Tr) r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm); and
annealing the insulation film at a temperature of about 300° C. to about 450° C. to remove moisture from the insulation film and increase its mechanical strength.

17. The method according to claim 16, wherein the reaction temperature is about −10° C. to about 50° C.

18. The method according to claim 16, wherein the residence time, Rt, is about 200 msec or longer.

19. The method according to claim 16, wherein the annealing is conducted at a temperature of about 300° C. to about 450° C. by radiating under reduced pressure the insulation film with UV light, infrared light, electron beams, or plasma using inert gas and/or reduction gas of $H_2$ or $NH_3$.

* * * * *